United States Patent
Takahashi (10) Patent No.: US 10,297,461 B2
(45) Date of Patent: May 21, 2019

(54) CMP POLISHING AGENT, MANUFACTURING METHOD THEREOF, AND METHOD FOR POLISHING SUBSTRATE

(71) Applicant: SHIN-ETSU CHEMICAL CO., LTD., Tokyo (JP)

(72) Inventor: Mitsuhito Takahashi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/511,095

(22) PCT Filed: Aug. 28, 2015

(86) PCT No.: PCT/JP2015/004360
§ 371 (c)(1),
(2) Date: Mar. 14, 2017

(87) PCT Pub. No.: WO2016/056165
PCT Pub. Date: Apr. 14, 2016

(65) Prior Publication Data
US 2017/0278718 A1    Sep. 28, 2017

(30) Foreign Application Priority Data
Oct. 9, 2014    (JP) .................................. 2014-208014

(51) Int. Cl.
*H01L 21/304* (2006.01)
*H01L 21/306* (2006.01)
(Continued)

(52) U.S. Cl.
CPC ...... *H01L 21/3212* (2013.01); *C01F 17/0043* (2013.01); *C09G 1/00* (2013.01);
(Continued)

(58) Field of Classification Search
None
See application file for complete search history.

(56) References Cited

U.S. PATENT DOCUMENTS 6,565,767 B2 * 5/2003 Hattori ..................... C09G 1/02
106/3
6,646,348 B1 * 11/2003 Grumbine ................ C09G 1/02
257/752
(Continued)

FOREIGN PATENT DOCUMENTS

CN        1636711 A       7/2005
CN      101541912 A       9/2009
(Continued)

OTHER PUBLICATIONS

Oct. 6, 2015 International Search Report issued in International Patent Application No. PCT/JP2015/004360.
(Continued)

*Primary Examiner* — Stephanie P Duclair
(74) *Attorney, Agent, or Firm* — Oliff PLC (57) ABSTRACT

The present invention provides a CMP polishing agent containing polishing particles, a protective agent, and water, wherein the protective agent is a silsesquioxane polymer having a polar group. This provides a CMP polishing agent which can reduce polishing scratches produced due to polishing in a CMP process and has high polishing selectivity.

13 Claims, 2 Drawing Sheets

(51) Int. Cl.
    *H01L 21/321*     (2006.01)
    *H01L 21/3105*    (2006.01)
    *H01L 21/762*     (2006.01)
    *C09G 1/00*       (2006.01)
    *C09G 1/02*       (2006.01)
    *C09G 1/04*       (2006.01)
    *C09G 1/12*       (2006.01)
    *C09K 3/14*       (2006.01)
    *C01F 17/00*      (2006.01)
    *C23F 3/04*       (2006.01)

(52) U.S. Cl.
    CPC ............... *C09G 1/02* (2013.01); *C09G 1/04* (2013.01); *C09G 1/12* (2013.01); *C09K 3/1463* (2013.01); *C23F 3/04* (2013.01); *H01L 21/304* (2013.01); *H01L 21/30625* (2013.01); *H01L 21/31053* (2013.01); *H01L 21/76224* (2013.01); *C01P 2004/62* (2013.01); *C01P 2004/64* (2013.01)

(56) References Cited

U.S. PATENT DOCUMENTS

| | | |
|---|---|---|
| 2005/0142362 A1 | 6/2005 | Inaoka et al. |
| 2010/0044625 A1 | 2/2010 | Nho et al. |
| 2011/0124195 A1 | 5/2011 | Park et al. |
| 2012/0129346 A1 | 5/2012 | Ryuzaki et al. |
| 2013/0178064 A1 | 7/2013 | Lim et al. |
| 2013/0244433 A1 | 9/2013 | Reiss et al. |
| 2014/0326701 A1 | 11/2014 | Venkataraman et al. |

FOREIGN PATENT DOCUMENTS

| | | |
|---|---|---|
| CN | 103975001 A | 8/2014 |
| CN | 104284960 A | 1/2015 |
| JP | H08-22970 A | 1/1996 |
| JP | H10-106994 A | 4/1998 |
| JP | 2005-186584 A | 7/2005 |
| JP | 2007-009080 A | 1/2007 |
| JP | 2007-084799 A | 4/2007 |
| JP | 2010-510157 A | 4/2010 |
| JP | 2011-529269 A | 12/2011 |
| JP | 4894981 B2 | 3/2012 |
| JP | 2012-084906 A | 4/2012 |
| WO | 2013/093556 A1 | 6/2013 |

OTHER PUBLICATIONS

Jan. 17, 2017 Office Action issued in Japanese Patent Application No. 2014-208014.
Apr. 11, 2017 International Preliminary Report on Patentability issued in International Patent Application No. PCT/JP2015/004360.
Apr. 8, 2018 Office Action issued in Chinese Application No. 201580054292.X.
Dec. 27, 2018 Office Action issued in Chinese Application No. 201580054292.X.

\* cited by examiner

CMP POLISHING AGENT, MANUFACTURING METHOD THEREOF, AND METHOD FOR POLISHING SUBSTRATE

TECHNICAL FIELD

The present invention relates to a CMP polishing agent, a manufacturing method thereof, and a method for polishing a substrate using the CMP polishing agent.

BACKGROUND ART

For improvement in integration and high performance of a large-scale semiconductor integrated circuit, an increase in density is required, and a reduction in working line width associated with miniaturization of a wiring pattern and realization of multilayered wiring lines are required to cope with the increase in density. Since such a multilayered wiring structure is formed by repeating formation of a conductive film or an insulator film and etching for several times, a difference in height on a surface tends to increase. On the other hand, a focal depth of a resist used for patterning of the wiring lines tends to shallow with miniaturization of the wiring lines, and the difference in height on the surface remarkably affects the patterning, which is seen as a problem. Based on such a background, extensive flattening which can eliminate the difference in height on the surface is required to facilitate the patterning.

As such an extensive flattening technology, there are known a coating technology of a resin such as a polyimide, an etch-back technology for a metal and an insulator film, a reflow technology for a metal and an insulator film, and a chemical mechanism polishing (CMP) technology.

The CMP is a method for pouring slurry containing polishing particles onto a substrate and using a polishing pad attached to a polishing apparatus to perform polishing. At this time, the polishing particles receive a pressure from the polishing apparatus and mechanically polish a surface, and a chemical component contained in the slurry chemically reacts the surface of the substrate so that a surface region of the substrate is thereby chemically removed.

In general, there are various kinds of slurry used for the CMP depending on types or characteristics of a polishing target film. As the polishing particles to be used, there are silica ($SiO_2$), ceria ($CeO_2$), alumina ($Al_2O_3$), titania ($TiO_2$), zirconia ($ZrO_2$), and the like, and they can be selectively used in accordance with the polishing target film.

As the CMP slurry which is used for flattening an insulator film such as a silicon oxide film, silica-based slurry is generally examined in conventional examples. The silica-based slurry is manufactured by performing grain growth of silica particles by pyrolysis of a silicon tetrachloride and carrying out pH control with the use of an alkali solution which does not contain an alkali metal such as ammonia.

Further, as the CMP slurry for an inorganic insulator film such as a silicon oxide film, ceria slurry is also used. Since ceria particles have a degree of hardness lower than that of silica particles or alumina particles, a defect such as a scratch is hardly generated on a film surface after the polishing, and hence the ceria particles are considered useful. Furthermore, the ceria particles are known as a strong oxidizing compound and have chemically active properties, and hence the ceria slurry is considered useful for the CMP polishing for an inorganic insulator film such as a silicon oxide film. The ceria slurry used in the CMP polishing is disclosed in Patent Document 1 and Patent Document 2.

In a conventional process of forming an STI (Shallow Trench Isolation), a process in which a silicon nitride film is used as a hard mask is carried out. After the silicon nitride film is formed on a substrate, a trench is formed in a predetermined region of the silicon nitride film and the substrate, a silicon oxide film is formed to fill the trench, and then the silicon oxide film is polished to form an element isolation film. At this time, dry ceria slurry which can assure a high polishing selection ratio of the silicon oxide film and the silicon nitride film is used to polish the silicon oxide film until the silicon nitride film is exposed.

On the other hand, in place of using the silicon nitride film as the hard mask, a polysilicon film is used as a polishing stop film in some situations. In this case, since the polysilicon film has a lower degree of hardness than that of the silicon nitride film, there is a problem that a defect such as a scratch (a scratch defect) is apt to be generated on a polysilicon film surface after the CMP polishing. When a defect, e.g., a scratch is generated on the polysilicon film surface after the CMP polishing, a disconnection failure, a short-circuit failure, or the like is produced in a fine transistor or wiring lines. Wet ceria has a polyhedral structure as compared with the dry ceria, can improve a scratch defect, and is more useful than the dry ceria, but the scratch defect produced in the CMP process has become a more serious problem with further miniaturization of a circuit dimension of a semiconductor device, and a further improvement is demanded.

Thus, as a method for reducing scratch defects, Patent Document 3 discloses a method for improving the scratch defects by using fine tetravalent metal hydroxide particles as abrasive grains. However, according to such a method, although the scratch defects can be improved by reducing a size of the abrasive grains, there arises a problem of a reduction in polishing speed.

Further, when a circuit dimension of a semiconductor device is further miniaturized, besides the scratch defects, a problem of insufficiency of a polishing section ratio arises. When the CMP polishing is performed with the use of a polishing agent having a low polishing selection ratio of a silicon oxide film and a polysilicon film, there occurs a problem that the polysilicon film as a polishing stop film is excessively polished, and an improvement is demanded.

For example, Patent Document 4 discloses slurry containing a polyoxyethyleneamine ether as a polysilicon polish finishing agent, and Patent Document 5 discloses slurry containing at least one type of saccharide selected from a group consisting of cationized polyvinyl alcohol, amino sugar or a derivative thereof, a polysaccharide having an amino sugar, and a derivative thereof. However, these types of slurry do not have a sufficient polysilicon film protecting function, and a problem of cleaning performance after the CMP polishing arises, and improvement is required.

CITATION LIST

Patent Literature

Patent Document 1: Japanese Unexamined Patent Application Publication No. H08-022970
Patent Document 2: Japanese Unexamined Patent Application Publication No. H10-106994
Patent Document 3: Japanese Unexamined Patent Application Publication No. 2012-084906

Patent Document 4: Japanese PCT National Publication No. 2011-529269
Patent Document 5: Japanese Patent No. 4894981

SUMMARY OF INVENTION

Technical Problem

In view of the problem, it is an object of the present invention to provide a CMP polishing agent which can reduce polishing scratches produced due to polishing in a CMP process and has a high polishing selection ratio.

Solution to Problem

To solve the problem, the present invention provides a CMP polishing agent containing polishing particles, a protective agent, and water, wherein the protective agent is a silsesquioxane polymer having a polar group.

Such a CMP polishing agent can reduce polishing scratches in the CMP process and has the high polishing selection ratio.

It is preferable that the polishing particles be wet ceria particles.

When the polishing particles are the wet ceria particles, generation of the polishing scratches can be further reduced.

It is preferable that the silsesquioxane polymer be a water-soluble silsesquioxane polymer having either or both of a sulfo group and a carboxy group as the polar group.

Such a silsesquioxane polymer can form a top coat more effectively to a polishing stop film by the sulfo group or the carboxy group, and hence the polishing selectivity can be enhanced.

Further, it is preferable that 0.1 part by mass or more and 1 part by mass or less of the silsesquioxane polymer be blended to 100 parts by mass of the CMP polishing agent.

When such a blending amount is adopted, the top coat can be sufficiently formed to the polishing stop film, and hence the polishing selectivity can be further enhanced.

Furthermore, it is preferable that the CMP polishing agent be a CMP polishing agent for polishing an insulator film.

Since the CMP polishing agent according to the present invention has the high polishing selectivity and enables accurately polishing the insulator film, it can be preferably used for polishing the insulator film in particular.

Moreover, it is preferable that pH of the CMP polishing agent be 3 or more and 7 or less.

When such pH is adopted, the CMP polishing agent which is superior in storage stability and polishing speed can be provided.

Additionally, the present invention provides a method for polishing a substrate including pressing an insulator film on a polishing stop film formed on a substrate against a polishing pad and pressurizing the same while supplying the CMP polishing agent onto the polishing pad configured to polish the substrate attached to an upper side of a turntable, and relatively moving the substrate and the turntable to polish the insulator film.

According to the method for polishing a substrate using the CMP polishing agent of the present invention, a high polishing selection ratio to a polishing stop film of the insulator film can be provided, the polishing stop film is not excessively polished, and highly accurate polishing can be performed. Further, defects such as scratches are hardly produced on a polished surface of the substrate.

It is preferable that the polishing stop film be a polysilicon film, and the insulator film be a silicon oxide film.

The polishing method according to the present invention is preferable particularly when an insulator film of a substrate having a silicon oxide film as the insulator film and having a polysilicon film as the polishing stop film, the high polishing selection ratio of the silicon oxide film to the polysilicon film can be provided, and defects such as scratches on the polished surface can be further reduced.

Furthermore, the present invention provides a method for manufacturing the CMP polishing agent, the method including a step of: adding a silsesquioxane polymer synthesized by a hydrolysis and a polycondensation reaction of an organic trialkoxysilane monomer containing a polar group as the protective agent.

According to such a manufacturing method, the CMP polishing agent which can reduce polishing scratches in a CMP process and has the high polishing selectivity can be assuredly manufactured.

Advantageous Effects of Invention

As described above, according to the CMP polishing agent of the present invention, in the CMP process, the high polishing selection ratio can be provided, and the highly accurate CMP polishing can be performed. Moreover, formation of scratches on the polished surface of the substrate can be suppressed.

Additionally, in particular, in case of performing the CMP polishing of the substrate having a silicon oxide film as the insulator film and having a polysilicon film as the polishing stop film, when the CMP polishing agent according to the present invention which contains as the protective agent a water-soluble silsesquioxane polymer having a polar group such as a sulfo group and a carboxy group is used, the higher polishing selection ratio can be provided while suppressing formation of polishing scratches.

DESCRIPTION OF EMBODIMENTS

An embodiment according to the present invention will now be described hereinafter, but the present invention is not restricted thereto.

As described above, development of the CMP polishing agent which can reduce polishing scratches formed due to polishing in a CMP process and has high polishing selectivity has been demanded.

The inventor has diligently investigated on the foregoing problem and found that the CMP polishing agent according to the present invention can reduce the polishing scratches by a function of the silsesquioxane polymer contained as the protective agent and the high polishing selectivity can be provided by a function of the polar group of the silsesquioxane polymer, thereby brought the present invention to completion.

That is, the present invention is a CMP polishing agent containing polishing particles, a protective agent, and water, wherein the protective agent is a silsesquioxane polymer having a polar group.

Here, a mechanism which can provide a high polishing speed ratio (a polishing selection ratio) which is one of effects of the present invention will now be described while taking a case of polishing a substrate having a silicon oxide film as an insulator film and also having a polysilicon film as a polishing stop film as an example.

According to the findings of the present inventor, since there is a difference in degree between an interaction of the silsesquioxane polymer (the polar group) to the silicon oxide film and an interaction of the silsesquioxane polymer (the polar group) to the polysilicon film, it is assumed that the high polishing selection ratio of the silicon oxide film to the polysilicon film can be obtained.

Figure 1:
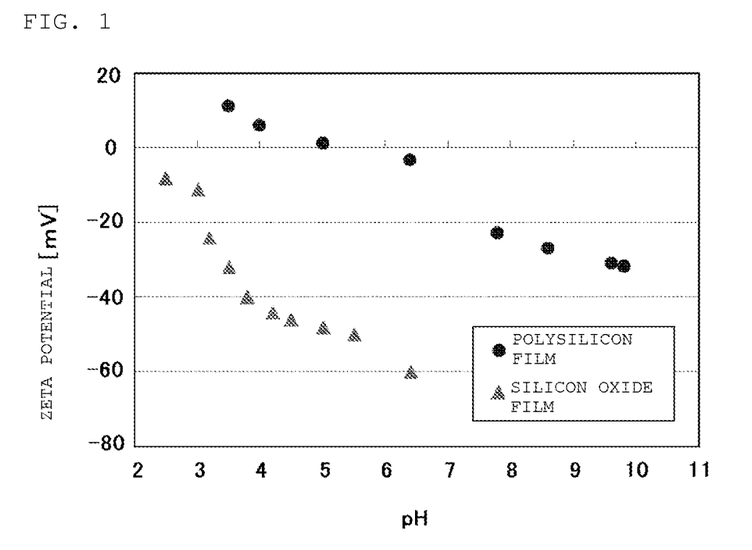
FIG. 1 is a view showing zeta potentials of a polysilicon film and a silicon oxide film to pH.

FIG. 1 shows a relationship between zeta potentials to pH of the silicon oxide film and the polysilicon film. Referring to FIG. 1, it can be understood that the polysilicon film has more positive potentials in the range of pH3 to pH7 than the silicon oxide film. Thus, it can be considered that, when a sulfo group or a carboxy group (the polar group) of the silsesquioxane polymer polarized to be negative effectively interacts with the polysilicon film having more positive potentials, the silsesquioxane polymer functions as a top coat to the polysilicon film and inhibits polishing of the polysilicon film, and a difference in polishing speed is produced to the silicon oxide film.

Further, in a CMP polishing process, polishing particles (abrasive grains) condense between abrasive grain surfaces during polishing or condense between a silicon oxide eliminated from the silicon oxide film which is a polished film and the abrasive grains to increase a particle size, and there is a risk that the abrasive grains having the increased size may produce scratch defects due to the polishing function. On the other hand, it can be considered that, when the silsesquioxane polymer is added, the abrasive grains having the increased size are trapped by a polymer network formed by the silsesquioxane polymer, and contact of the abrasive grains having the increased size to the polished film can be suppressed, and hence generation of scratch defects can be suppressed.

The CMP polishing agent according to the present invention, a manufacturing method thereof, and a method for polishing a substrate using the CMP polishing agent according to the present invention will now be described hereinafter in more detail.

<CMP Polishing Agent>

The CMP polishing agent according to the present invention contains polishing particles, a protective agent, and water, wherein the protective agent is a silsesquioxane polymer having a polar group.

[Polishing Particles]

Although the polishing particles contained in the CMP polishing agent according to the present invention are not restricted in particular, when a polishing target is a silicon oxide film, wet ceria particles are preferable. As to the wet ceria particles, particles each having a large secondary particle diameter are not produced, the wet ceria particles have a polyhedral structure, and hence they are preferable in that polishing scratches such as micro scratches can be improved.

In the present invention, as regards an average particle diameter of the wet ceria particles, a range of 5 nm to 200 nm is preferable, a range of 20 nm to 100 nm is more preferable, and a range of 40 nm to 70 nm is further preferable. When such an average particle diameter is adopted, the average particle diameter of the wet ceria particles is not too small, and a polishing speed for the polishing target film is not too low. Further, since the average particle diameter of the wet ceria particles is not too large, generation of polishing scratches such as micro scratches can be suppressed.

Although a blending amount of the polishing particles is not restricted in particular, from the viewpoint that a polishing speed preferable for the insulator film can be provided, 0.1 part by mass or more is preferable, 0.5 part by mass or more is more preferable, and 1 part by mass or more is further preferable, based on 100 parts by mass of the CMP polishing agent. Moreover, as an upper limit of the blending amount of the polishing particles, from the viewpoint that storage stability of the CMP polishing agent can be enhanced, 20 parts by mass or less is preferable, 10 parts by mass or less is more preferable, and 5 parts by mass is further preferable.

As a method for manufacturing the wet ceria particles, a method for manufacturing the wet ceria particles by using cerium salt as a precursor material and mixing it with an alkaline solution and performing a heat treatment (a wet precipitation method) is preferable. This manufacturing method will now be specifically described hereinafter.

First, the cerium salt which is a precursor of the wet ceria particles is mixed with ultrapure water to manufacture a cerium aqueous solution. The cerium salt and the ultrapure water can be mixed in a ratio of, e.g., 2:1 to 4:1. Here, as the cerium salt, at least either Ce (III) salt or Ce (IV) salt can be used. That is, at least one of the Ce (III) salt can be mixed with ultrapure water, at least one of the Ce (IV) salt can be mixed with ultrapure water, or at least one of the Ce (III) salt and at least one of the Ce (IV) salt can be mixed with ultrapure water.

Illustrative examples of the Ce (III) salt which can be used include cerium chloride (III), cerium fluoride (III), cerium sulfate (III), cerium nitrate (III), cerium carbonate (III), cerium perchlorate (III), cerium bromide (III), cerium sulfide (III), cerium iodide (III), cerium oxalate (III), cerium acetate (III), and the like.

Illustrative examples of the Ce (IV) salt which can be used include cerium sulfate (IV), ammonium cerium nitrate (IV), cerium hydroxide (IV), and the like.

Among these, cerium nitrate (III) as the Ce (III) salt and ammonium cerium nitrate (IV) as the Ce (IV) salt are particularly preferable in terms of ease of use.

Moreover, to stabilize the cerium aqueous solution manufactured by mixing with ultrapure water, an acid solution can be mixed. Here, the acid solution and the cerium solution can be mixed in a ratio of 1:1 to 1:100. Illustrative examples of the acid solution which can be used here include a hydrogen peroxide, a nitric acid, an acetic acid, a hydrochloric acid, a sulfuric acid, and the like. It is possible to adjust pH of the cerium solution mixed with the acid solution to, e.g., 0.01.

Here, an alkaline solution is manufactured separately from the cerium solution. As the alkaline solution, ammonia, a sodium hydroxide, a potassium hydroxide, or the like can be used, and it is mixed with ultrapure water, diluted to appropriate concentration, and then used. As regards a dilution ratio, an alkaline material and ultrapure water can be mixed in a ratio of 1:1 to 1:100. It is possible to adjust pH of the diluted alkaline solution to. e.g., 11 to 13.

Then, the diluted alkaline solution is moved to a reaction container, and then agitation is performed for, e.g., five hours or less in an inert gas atmosphere of nitrogen, argon, helium, or the like. Further, the cerium aqueous solution is mixed with the diluted alkaline solution at a rate of 0.1 L per second or more. Furthermore, subsequently, a heat treatment is carried out at a predetermined temperature. A heat treatment temperature at this time can be set to 100° C. or less, for example, 60° C. or more and 100° C. or less, and a heat treatment time can be set to two hours or more, for example, 2 hours to 10 hours. Moreover, a temperature rising speed from an ordinary temperature to the heat treatment temperature can be set to 0.2° C. to 1° C. per minute or preferably 0.5° C. per minute.

At last, the mixed solution subjected to the heat treatment is cooled to a room temperature. The wet ceria particles having a primary particle diameter of, e.g., 100 nm or less can be manufactured through such a process.

As described above, the wet ceria particles can be manufactured by increasing a temperature of a mixture of the cerium salt aqueous solution which is the precursor and the diluted alkaline solution at an appropriate temperature rising speed, heating the mixture at the heat treatment temperature in an appropriate range so that the cerium salt in the mixture reacts during the temperature rising process to generate fine nuclei of ceria ($CeO_2$), and growing crystals with these fine nuclei at the center, and they can be manufactured in the form of crystal particles of, e.g., 5 nm to 100 nm.

[Protective Agent]

The CMP polishing agent according to the present invention is characterized by containing a silsesquioxane polymer having a polar group as a protective agent. When such a protective agent is contained, the CMP polishing agent which can reduce the polishing scratches and has the high polishing selectivity can be provided.

More specifically, the polar group of the silsesquioxane polymer is polarized and interacts with a polishing stop film such as a polysilicon film, a top coat is thereby formed on a surface of the polishing stop film, polishing is inhibited by this top coat to generate a difference in polishing speed between the polishing target film and the polishing stop film, and a polishing speed ratio of the polishing target film to the polishing stop film can be increased.

Additionally, since the polishing particles which have been large particles during the CMP polishing process can be trapped by a polymer network formed by the silsesquioxane polymer so that contact of the polishing particles which have been the large particles with the polishing target film can be suppressed, generation of the scratch defects can be suppressed.

As such a silsesquioxane polymer having the polar group, a water-soluble silsesquioxane polymer having either or both of a sulfo group and a carboxy group as the polar group is preferable. When such a silsesquioxane polymer is used, since the top coat can be more effectively formed to the polishing stop film by the sulfo group or the carboxy group, the polishing selectivity can be increased. Further, solubility to water is improved, and hence dispersibility in the CMP polishing agent becomes excellent.

The silsesquioxane polymer having the polar group can be synthesized by, e.g., a hydrolysis and a polycondensation reaction of an organic trialkoxysilane monomer containing a polar group.

Examples of the organic trialkoxysilane monomer containing a polar group used for synthesis include the following materials.

As a monomer whose polar group serves as a sulfo group, there is an organic trialkoxysilane containing a mercapto group which is a substituent forming the sulfo group by an oxidation reaction under a basic condition. Illustrative examples of the organic trialkoxysilane monomer containing the mercapto group include 3-mercaptopropyltrimethoxysilane, 3-mercaptopropyltriethoxysilane, and 11-mercaptoundecyltrimethoxysilane, and among these, 3-mercaptopropyltrimethoxysilane is particularly preferable in terms of reactivity.

As a monomer whose polar group serves as the carboxy group, there is an organic trialkoxysilane containing a cyano group which is a substitute forming the carboxy group by the hydrolysis under the basic condition. Illustrative examples of the organic trialkoxysilane monomer containing the cyano group include 2-cyanoethyltrimethoxysilane, 2-cyanoethyltriethoxysilane, 3-cyanopropyltrimethoxysilane, 3-cyanopropyltriethoxysilane, and 11-cyanoundecyltrimethoxysilane, and among these, 2-cyanoethyltrimethoxysilane is particularly preferable in terms of reactivity.

It is to be noted that the polar group of the silsesquioxane polymer used as the protective agent in the present invention is not restricted to the sulfo group and the carboxy group as a matter of course, and it can be appropriately selected in accordance with a type of the polishing target film or the polishing stop film, a combination of these films, etc.

It is preferable to set a blending amount of the silsesquioxane polymer having the polar group to 0.1 part by mass or more and 1 part by mass or less, based on 100 parts by mass of the CMP polishing agent. When such a blending amount is adopted, the top coat can be sufficiently formed to the polishing stop film, and hence the CMP polishing agent having the higher polishing selectivity can be provided.

[Water]

Water used in the CMP polishing agent according to the present invention is not restricted in particular, and pure water, ultrapure water, or the like could be used. Furthermore, a blending amount of the water is not restricted in particular, but a range of 80 parts by mass or more and 99.8 parts by mass or less is preferable and a range of 90 parts by mass or more and 99 parts by mass or less is more preferable, based on 100 parts by mass of the CMP polishing agent.

[Other Additives]

Besides the essential components, an additive or the like which adjusts, e.g., polishing characteristics can be blended into the CMP polishing agent according to the present invention.

Such an additive can contain an anionic surfactant or an amino acid which can convert surface potentials of the polishing particles to negative.

Illustrative examples of the anionic surfactant include a monoalkyl sulfate, an alkylpolyoxyethylene sulfate, an alkylbenzenesulfonate, a monoalkylphosphate, a laurylsulfate, a polycarboxylic acid, a polyacrylate, a polymethacrylate, and the like.

Illustrative examples of the amino acid include arginine, lysine, aspartic acid, glutamic acid, asparagine, glutamine, histidine, proline, tyrosine, serine, tryptophan, threonine, glycine, alanine, methionine, cysteine, phenylalanine, leucine, valine, isoleucine, and the like.

When using such additives, it is preferable to set a blending amount of the addition agent to 0.01 part by mass or more and 0.1 part by mass or less, based on 1 part by mass of the polishing particles. Further, it is further preferable to set the same to 0.02 part by mass or more and 0.06 part by mass or less, based on 1 part by mass of the polishing particles.

If the blending amount is 0.01 part by mass or more, based on 1 part by mass of the polishing particles, a decrease in dispersion stability of the CMP polishing agent can be suppressed. Furthermore, if the blending amount is 0.1 part by mass or less, based on 1 part by mass of the polishing particles, polishing of the polishing target film is not inhibited, and a problem of a reduction in polishing speed does not occur. Thus, adjusting to such a blending amount enables improving the dispersion stability of the CMP polishing agent without inhibiting the polishing.

It is preferable that pH of the CMP polishing agent according to the present invention fall within the range of 3.0 to 7.0 from the viewpoint of superiority in storage stability of the CMP polishing agent or a polishing speed. A lower limit value of pH influences the dispersion stability, and is preferably 4.0 or more, or more preferably 6.0 or more. Moreover, an upper limit value of pH influences the polishing speed, and is preferably 7.0 or less. When pH is 7.0 or less, the polishing speed of the polysilicon film does not precipitously increases due to basic properties, and a polishing selection ratio of the silicon oxide film to the polysilicon film does not decrease.

Additionally, to adjust pH of the CMP polishing agent, it is possible to add an acid, e.g., an inorganic acid such as a hydrochloric acid, a nitric acid, a sulfuric acid, or a phosphoric acid, an organic acid such as a formic acid, an acetic acid, a citric acid, or an oxalic acid, or a base such as ammonia, a sodium hydroxide, a potassium hydroxide, or a tetramethylammonium hydroxide (TMAH), or the like.

The CMP polishing agent according to the present invention has the high polishing selectivity and enables precisely polishing the insulator film, and hence it can be preferably used for polishing of the insulator film in particular.

<Method for Manufacturing CMP Polishing Agent>

The CMP polishing agent according to the present invention can be manufactured by mixing the polishing particles, the protective agent, the water, and the addition agent, if needed, which are described above. It is to be noted that, when manufacturing is performed by using a method including a step of adding the silsesquioxane polymer synthesized by the hydrolysis and the polycondensation reaction of the organic trialkoxysilane monomer containing a polar group, the CMP polishing agent according to the present invention can be assuredly manufactured.

Further, after the mixing, ultrasonic dispersion or filtration using a filter may be carried out.

<Polishing Method>

A method for polishing a substrate using the CMP polishing agent according to the present invention will now be described. An example where one side of a semiconductor substrate is subjected to CMP polishing will be described hereinafter.

Figure 2:
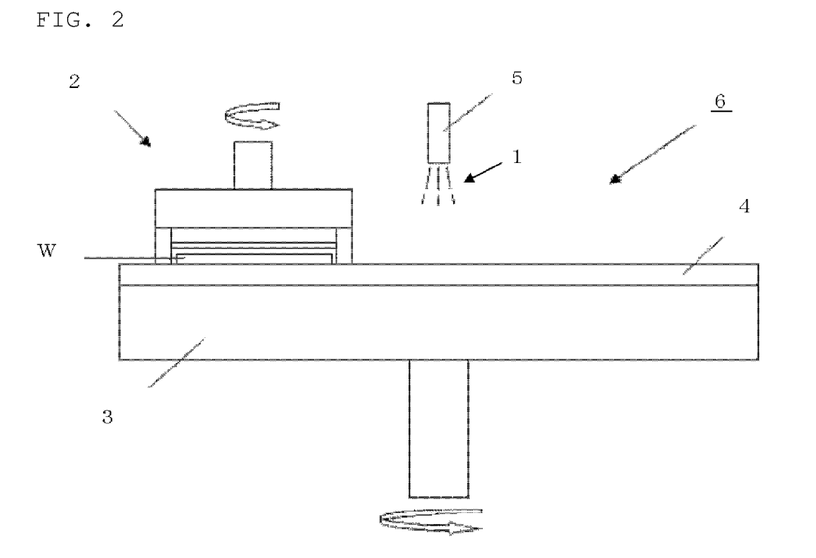
FIG. 2 is a schematic view showing an example of a single-side polishing apparatus which can be used in a polishing method according to the present invention.

For example, as shown in FIG. 2, the single-side polishing apparatus may be a single-side polishing apparatus 6 constituted of a turntable 3 having a polishing pad 4 attached thereto, a polishing agent supply mechanism 5, a polishing head 2, etc.

In such a single-side polishing apparatus 6, a substrate W is held by the polishing head 2, the CMP polishing agent 1 according to the present invention is supplied onto the polishing pad 4 from the polishing agent supply mechanism 5, the turntable 3 and the polishing head 2 are rotated each other so that a surface of the substrate W is slid on the polishing pad 4, thereby performing polishing.

As the polishing pad, a non-woven fabric, polyurethane foam, a porous resin, or the like can be used. Furthermore, it is preferable to continuously supply the CMP polishing agent 1 by using the polishing agent supply mechanism 5 including a pump or the like so that a pad surface is constantly covered with the polishing agent while the polishing is performed.

Moreover, according to the polishing method in the present invention, an insulator film on a polishing stop film formed on the substrate W is pressed against the polishing pad 4 and pressurized while the CMP polishing agent 1 of the present invention is supplied onto the polishing pad 4 attached to an upper surface of the turntable 3, and the substrate W and the turntable 3 are relatively moved to polish the insulator film.

Here, the substrate W as a polishing target is a substrate concerning manufacture of a semiconductor device, and examples thereof include a substrate having an insulator film and a polishing stop film formed on a semiconductor substrate on which an STI pattern, a wiring pattern, and the like are formed. The polishing target film is an insulator film formed on these patterns, and examples thereof include a silicon oxide film and the like. Additionally, examples of the polishing stop film include a polysilicon film and the like. When the insulator film formed on such a semiconductor substrate is polished with the use of the CMP polishing agent according to the present invention, the surface of the semiconductor substrate can be turned to a flat surface.

The polishing method using the CMP polishing agent according to the present invention can be particularly preferably used for polishing a substrate having a polysilicon film as the polishing stop film on a lower side (a base substrate side) of the polishing target film which is an insulator film or the like made of, e.g., a silicon oxide, and examples of such a substrate include an NAND flash memory device substrate. A description will now be given as to an example where the CMP polishing agent according to the present invention is applied to the CMP process of this NAND flash memory device substrate.

Figure 3:
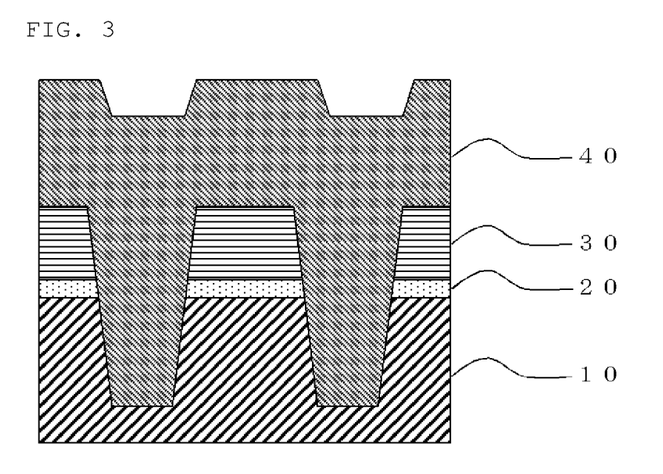
FIG. 3 is a cross-sectional view of a semiconductor device in which a conductive film is formed as a polishing stop film.

For example, in the NAND flash memory device substrate, as shown in FIG. 3, a conductive film 30, a tunnel oxide film 20, and a base substrate 10 in predetermined regions are etched to reach a predetermined depth to form a plurality of trenches, and an insulator film 40 is formed to fill the trenches. Here, the conductive film 30 is formed of a polysilicon film or the like which serves as a floating gate, and it also has a role as the polishing stop film in this case.

The insulator film 40 is made of an oxide film type material, and examples of such an insulator film include a BPSG film, a PSG film, an HDP film, a TEOS film, a USG film, a PETEOS film, an HARP film, and the like. Further, examples of a method for forming the insulator film 40 include a PVD method, a CVD method, an MOCVD method, an ALD method, and the like.

Furthermore, examples of the base substrate 10 include a silicon substrate and the like.

Figure 4:
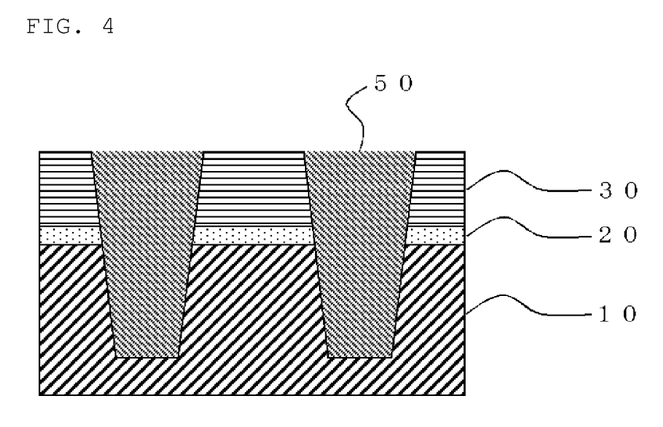
FIG. 4 is a cross-sectional view of a semiconductor device after an insulator film is CMP-polished with the use of the CMP polishing agent according to the present invention.

The NAND flash memory device substrate having the base substrate 10 with the insulator film 40 filling the trenches as shown in FIG. 3 is set in the polishing apparatus as shown in FIG. 2, then the insulator film 40 is polished with the use of the CMP polishing agent according to the present invention until the conductive film 30 is exposed, whereby the insulator film 40 is polished and removed and an STI separation film 50 is formed as shown in FIG. 4.

At this time, it is preferable that a polishing selection ratio of the insulator film 40 to the conductive film 30 be 10 or more. When the polishing selection ratio is 10 or more, since there is difference in polishing speed between the insulator film 40 and the conductive film 30, detection of a polishing stop position can be facilitated, the insulator film 40 and the conductive film 30 are not polished excessively, and generation of defects can be suppressed. Thus, setting such a polishing selection ratio is further preferable for formation of the STI separation film. Furthermore, according to the present invention, this polishing selection ratio of the insulator film to the conductive film can be set to, e.g., 90 or more.

As described above, when the CMP polishing agent containing the silsesquioxane polymer having a polar group is applied to the CMP polishing of the insulator film 40 when the conductive film 30 is adopted as the polishing stop film, the high polishing selection ratio of the insulator film 40 to the conductive film 30 can be provided, and applying the present invention to, e.g., STI formation enables forming an STI film having less defects such as polishing scratches.

EXAMPLES

Although the present invention will now be specifically described hereinafter in conjunction with examples and comparative examples, the present invention is not restricted to the following examples.
(Synthesis of Wet Ceria)

100 g of a nitric acid was mixed in a solution obtained by dissolving 1,000 g of a cerium nitrate hexahydrate (Ce$(NO_3)_3 \cdot 6H_2O$) in 250 g of pure water, thereby providing a cerium (III) solution. Then, 1 g of a diammonium cerium nitrate (($NH_4)_2Ce(NO_3)_3$) was dissolved in 500 g of pure water to provide a cerium (IV) solution. Subsequently, the cerium (III) solution was mixed with the cerium (IV) solution to provide a cerium mixed solution.

Then, 4,000 g of pure water was dropped into a reaction container under a nitrogen gas atmosphere, thereafter 1,000 g of ammonia water was dropped into the reaction container, and they were agitated to provide an alkaline solution.

Then, the cerium mixture was dropped into the reaction container, mixed with an alkaline solution, agitated, and heated to 80° C. under a nitrogen gas atmosphere. A heat treatment was performed for eight hours to provide a liquid mixture containing ceria particles.

The liquid mixture containing the ceria particles was cooled to a room temperature, then the nitric acid was dropped into the liquid mixture, pH of the liquid mixture was adjusted to 4 or less, and a reaction was completed. The ceria particles in the liquid mixture were precipitated, then cleaning using pure water and centrifugal separation were repeated for several times to clean the ceria particles, and the ceria particles were finally provided.
(Synthesis of Silsesquioxane Polymer)

3-mercaptopropyltrimethoxysilane and 2-cyanoethyltrimethoxysilane were hydrolyzed/condensed to synthesize a silsesquioxane polymer having a sulfo group and a silsesquioxane polymer having a carboxy group, respectively.
(Preparation of CMP Polishing Agent)

The ceria particles and the silsesquioxane polymer synthesized by the method, and pure water were mixed, and ultrasonic dispersion was carried out for 60 minutes while performing agitation. Obtained slurry was filtered by a 0.5-μm filter and diluted with pure water, thereby preparing a CMP polishing agent.
(Polishing of Insulator Film)

A silicon substrate having a silicon oxide film ($SiO_2$ film) formed thereon by a plasma CVD method is set to the polishing head of the single-side polishing apparatus shown in FIG. 2 with a surface of the silicon oxide film facing down. Further, polishing was performed for 60 seconds by using a polishing pad (IC1000/SubaIV CMP pad: Dow-chemical) while supplying 100 mL of the prepared CMP polishing agents per minute with a polishing load of 6 psi (pound per square inch) at 70 rpm which is a rotation rate of a turntable and the polishing head. After completion of the polishing, the substrate was removed from the polishing head, cleaned with pure water, then further subjected to the ultrasonic cleaning, and dried at 80° C. by using a dryer. Subsequently, changes in film thickness before and after the polishing were measured by a spectroscopic ellipsometer to calculate a polishing speed. Likewise, a silicon substrate having a polysilicon film (a Poly-Si film) formed thereon by a low-pressure CVD method was polished under the same conditions, and changes in film thickness before and after the polishing were measured to calculate a polishing speed. Furthermore, the number of polishing scratches generated on a polysilicon film surface after the polishing was obtained by a scanning electron microscope.

Example 1

500 g of ceria particles, 15 g of a silsesquioxane polymer having a sulfo group as a polar group, and 5,000 g of pure water were mixed, ultrasonic dispersion was carried out for 60 minutes while performing agitation, then a mixture was filtered by a 0.5-μm filter and further diluted with pure water to prepare a CMP polishing agent having ceria particle concentration of 1 mass % and silsesquioxane polymer concentration of 0.15 mass %.

pH of the obtained CMP polishing agent was 6.3. A particle size distribution was measured by an ultrasonic attenuation type particle size analyzer (Zeta-APS: manufactured by Matec), and a result showed that an average particle diameter was 0.10 μm.

Example 2

The CMP polishing agent was prepared by the same procedure as that of Example 1 except that a silsesquioxane polymer having a carboxy group as the polar group was added in place of the silsesquioxane polymer having the sulfo group as the polar group.

pH of the obtained CMP polishing agent was 6.5. A particle size distribution was measured by the ultrasonic attenuation type particle size analyzer (Zeta-APS: manufactured by Matec), and a result showed that an average particle diameter was 0.11 μm.

Comparative Example 1

The CMP polishing agent was prepared by the same procedure as that of Example 1 except that the silsesquioxane polymer was not added.

pH of the obtained CMP polishing agent was 6.0. A particle size distribution was measured by the ultrasonic attenuation type particle size analyzer (Zeta-APS: manufactured by Matec), and a result showed that an average particle diameter was 0.11 μm.

Comparative Example 2

The CMP polishing agent was prepared by the same procedure as that of Example 1 except that polymethacrylic acid ammonium salt was added in place of the silsesquioxane polymer.

pH of the obtained ceria polishing agent was 6.6. A particle size distribution was measured by the ultrasonic attenuation type particle size analyzer (Zeta-APS: manufactured by Matec), and a result showed that an average particle diameter was 0.10 μm.

The above-mentioned substrate was set in the polishing apparatus, and the CMP polishing was performed for 60 seconds under the above-mentioned polishing conditions by using the CMP polishing agents prepared in Examples and Comparative Examples. Polishing speeds of the silicon oxide film and the polysilicon film were calculated by measuring changes in film thickness before and after the polishing. Table 1 shows results. It is to be noted that figures in the table are average values of the five substrates subjected to the CMP polishing in Examples and Comparative Examples.

TABLE 1

| | Protective agent type and polar group | | Polishing speed | | Polishing selection ratio | Polishing scratch (quantity) |
|---|---|---|---|---|---|---|
| | Protective agent | Polar group | $SiO_2$ film (Å/min) | Poly-Si film (Å/min) | | |
| Example 1 | Silsesquioxane polymer | Sulfo group | 1400 | 15 | 93.3 | 0 |
| Example 2 | Silsesquioxane polymer | Carboxy group | 1500 | 16 | 93.7 | 0 |
| Comparative Example 1 | — | — | 1900 | 600 | 3.2 | 16 |
| Comparative Example 2 | Polyacrylic acid ammonium salt | — | 1300 | 60 | 21.7 | 8 |

As shown in Table 1, when the CMP polishing was performed with the use of the CMP polishing agents of Examples 1 and 2 containing the silsesquioxane polymer having the polar group as a protective agent, each polishing selection ratio of an insulator film (the silicon oxide film) to a polishing stop film (the polysilicon film) was 90 or more, and the polishing selection ratio much higher than those of Comparative Examples was obtained. Moreover, no polishing scratches were produced, and the number of the polishing scratches were greatly reduced as compared with Comparative Examples.

On the other hand, when the CMP polishing was performed with the use of the CMP polishing agent of Comparative Example 1 having no protective agent added thereto, a polishing selection ratio to the polysilicon film was small, and many polishing scratches were produced.

Additionally, when the CMP polishing was performed with the use of the CMP polishing agent of Comparative Example 2 using the polymethacrylic acid ammonium salt in place of the silsesquioxane polymer as the protective agent, an improvement in polishing selection ratio to the polysilicon film or a polishing scratch reducing effect was obtained to some extent, but this result was far inferior to the CMP polishing agents of Examples.

As described above, it has been revealed that performing the CMP polishing using the polysilicon film as the polishing stop film with the CMP polishing agent of the present invention enables obtaining the high polishing selection ratio to the polysilicon film and enables polishing with less production of polishing scratches.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A CMP polishing agent comprising polishing particles, a protective agent, and water, wherein the protective agent is a silsesquioxane polymer having a polar group, and the silsesquioxane polymer is a water-soluble silsesquioxane polymer having either a sulfo group or both of a sulfo group and a carboxy group as the polar group.

2. The CMP polishing agent according to claim 1, wherein the polishing particles are wet ceria particles.

3. The CMP polishing agent according to claim 2, wherein 0.1 part by mass or more and 1 part by mass or less of the silsesquioxane polymer is blended to 100 parts by mass of the CMP polishing agent.

4. The CMP polishing agent according to claim 2, wherein pH of the CMP polishing agent is 3 or more and 7 or less.

5. A method for manufacturing the CMP polishing agent according to claim 2, the method comprising a step of: adding a silsesquioxane polymer synthesized by a hydrolysis and a polycondensation reaction of an organic trialkoxysilane monomer containing a polar group as the protective agent.

6. The CMP polishing agent according to claim 1, wherein 0.1 part by mass or more and 1 part by mass or less of the silsesquioxane polymer is blended to 100 parts by mass of the CMP polishing agent.

7. The CMP polishing agent according to claim 1, wherein the CMP polishing agent is a CMP polishing agent for polishing an insulator film.

8. The CMP polishing agent according to claim 1, wherein pH of the CMP polishing agent is 3 or more and 7 or less.

9. A method for manufacturing the CMP polishing agent according to claim 1, the method comprising a step of: adding a silsesquioxane polymer synthesized by a hydrolysis and a polycondensation reaction of an organic trialkoxysilane monomer containing a polar group as the protective agent.

10. A method for polishing a substrate comprising pressing an insulator film on a polishing stop film formed on a substrate against a polishing pad and pressurizing the same while supplying the CMP polishing agent according to claim 1 onto the polishing pad configured to polish the substrate attached to an upper side of a turntable, and relatively moving the substrate and the turntable to polish the insulator film.

11. The method for polishing a substrate according to claim 10, wherein the polishing stop film is a polysilicon film, and the insulator film is a silicon oxide film.

12. A method for polishing a substrate comprising pressing an insulator film on a polishing stop film formed on a substrate against a polishing pad and pressurizing the same while supplying the CMP polishing agent according to claim 2 onto the polishing pad configured to polish the substrate attached to an upper side of a turntable, and relatively moving the substrate and the turntable to polish the insulator film.

13. The method for polishing a substrate according to claim 12, wherein the polishing stop film is a polysilicon film, and the insulator film is a silicon oxide film.

* * * * *